(12) United States Patent
Sridharan et al.

(10) Patent No.: US 11,404,094 B2
(45) Date of Patent: Aug. 2, 2022

(54) TRANSMITTER CIRCUITRY WITH N-TYPE PULL-UP TRANSISTOR AND LOW OUTPUT VOLTAGE SWING

(71) Applicant: Intel Corporation, Santa Clara, CA (US)

(72) Inventors: Harishankar Sridharan, Santa Clara, CA (US); Karthik Tyamgondlu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 621 days.

(21) Appl. No.: 16/144,944

(22) Filed: Sep. 27, 2018

(65) Prior Publication Data
US 2020/0105316 A1    Apr. 2, 2020

(51) Int. Cl.
*G06F 1/26* (2006.01)
*G06F 1/28* (2006.01)
(Continued)

(52) U.S. Cl.
CPC .................. *G11C 7/10* (2013.01); *G06F 1/26* (2013.01); *G06F 1/28* (2013.01); *G11C 5/14* (2013.01); *G11C 7/00* (2013.01); *G11C 7/1057* (2013.01); *G11C 7/1087* (2013.01); *G11C 11/40* (2013.01); *G11C 11/4074* (2013.01); *G11C 11/4093* (2013.01); *G11C 11/4096* (2013.01); *H03K 17/687* (2013.01); *H03K 17/6872* (2013.01); *H03K 19/00* (2013.01); *H03K 19/0005* (2013.01); *H03K 19/0008* (2013.01); *H03K 19/0013* (2013.01); *H03K 19/00361* (2013.01); *H03K 19/00384* (2013.01); *H03K 19/0175* (2013.01); *H03K 19/0185* (2013.01); *H03K 19/017509* (2013.01);
(Continued)

(58) Field of Classification Search
None
See application file for complete search history.

(56) References Cited

U.S. PATENT DOCUMENTS 6,066,977 A * 5/2000 Felton ............ H03K 19/018585
327/390
6,229,351 B1 * 5/2001 Wang ..................... G01R 19/00
327/81

(Continued)

FOREIGN PATENT DOCUMENTS

KR    1020170092434    8/2017

OTHER PUBLICATIONS

International Search Report & Written Opinion dated Oct. 25, 2019 for PCT Patent Application No. PCT/US2019/039599.

(Continued)

*Primary Examiner* — Tanh Q Nguyen
(74) *Attorney, Agent, or Firm* — Schwabe, Williamson & Wyatt, P.C.

(57) ABSTRACT

An apparatus is provided, where the apparatus includes a first transistor coupled between a supply node and an output node; a resistor and a second transistor coupled in series between the output node and a ground terminal; a circuitry to receive data, and to output a first control signal and a second control signal to respectively control the first transistor and the second transistor, wherein an output signal at the output node is indicative of the data, and wherein the first transistor is a N-type transistor.

6 Claims, 9 Drawing Sheets

(51) Int. Cl.

| | |
|---|---|
| *G06F 1/00* | (2006.01) |
| *G06F 11/30* | (2006.01) |
| *H03K 3/00* | (2006.01) |
| *G11C 7/10* | (2006.01) |
| *H03K 17/687* | (2006.01) |
| *H03K 19/00* | (2006.01) |
| *H03K 19/0175* | (2006.01) |
| *G11C 5/14* | (2006.01) |
| *G11C 11/4096* | (2006.01) |
| *H03K 19/0185* | (2006.01) |
| *G11C 11/40* | (2006.01) |
| *H03K 19/173* | (2006.01) |
| *G11C 11/4074* | (2006.01) |
| *G11C 11/4093* | (2006.01) |
| *H03K 19/003* | (2006.01) |
| *G11C 7/00* | (2006.01) |
| *H03L 7/081* | (2006.01) |

(52) U.S. Cl.
CPC ............ *H03K 19/017518* (2013.01); *H03K 19/017545* (2013.01); *H03K 19/018521* (2013.01); *H03K 19/018585* (2013.01); *H03K 19/173* (2013.01); *H03K 19/1733* (2013.01); *H03L 7/0812* (2013.01)

(56) References Cited

U.S. PATENT DOCUMENTS

| | | | |
|---|---|---|---|
| 9,608,624 B2* | 3/2017 | Chen | H03K 17/687 |
| 9,762,237 B1 | 9/2017 | Isakanian | |
| 9,997,214 B1* | 6/2018 | Kumar | G11C 11/40 |
| 2002/0158674 A1* | 10/2002 | Ang | H03K 19/00384 |
| | | | 327/108 |
| 2003/0080780 A1* | 5/2003 | Okamoto | G11C 7/1057 |
| | | | 326/83 |
| 2013/0208550 A1 | 8/2013 | Sforzin | |
| 2014/0009999 A1 | 1/2014 | Chuang et al. | |
| 2014/0184523 A1 | 7/2014 | McCall et al. | |
| 2016/0012885 A1* | 1/2016 | Kamalanathan | G11C 13/004 |
| | | | 365/148 |
| 2016/0241246 A1* | 8/2016 | Potluri | H03K 19/018521 |
| 2017/0011787 A1* | 1/2017 | Kang | G11C 7/1087 |
| 2017/0040995 A1* | 2/2017 | Li | G11C 7/1069 |
| 2017/0222649 A1* | 8/2017 | Koo | H03K 19/0013 |
| 2018/0096727 A1* | 4/2018 | Polizzi | G11C 13/0033 |
| 2020/0105316 A1* | 4/2020 | Sridharan | H03K 17/6872 |

OTHER PUBLICATIONS

International Preliminary Report on Patentability dated Apr. 9, 2021 for PCT Patent Application No. PCT/US2019/039599.

* cited by examiner

TRANSMITTER CIRCUITRY WITH N-TYPE PULL-UP TRANSISTOR AND LOW OUTPUT VOLTAGE SWING

BACKGROUND

Modern computing devices are becoming power efficient. For example, Input/Output (I/O) supply voltage in current and earlier generations of Double Data Rate (DDR) memory (e.g., DDR1, DDR2, DDR3, DDR4, etc.) are equal to, or higher than about 1.2 volts (V). However, newer generation DDR memory (e.g., DDR5, Low Power DDR, such as LP4x, LP5, etc.) has much lower I/O supply voltage, e.g., in the range of 0.3-0.6 V. It may be desirable to take advantage of such low I/O supply voltage, e.g., to design more efficient, and power and area optimized I/O design for newer generation memory systems.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Current and older generations of memory devices (e.g., DDR1, DDR2, DDR3, DDR4, etc.) have a higher supply voltage (e.g., higher than 1 V) to drive a driver circuitry of a transmitter. Accordingly, as discussed in further details herein, P-type transistors are used as pull-up transistors in the driver circuitry.

However, newer generations of memory devices (e.g., LP4x, LP5, etc.) have substantially lower supply voltage (e.g., lower than 0.7 V) to drive the driver circuitry of the transmitter. Accordingly, as discussed in further details herein, N-type transistors can be used as pull-up transistors in the driver circuitry. Thus, in some embodiments, a transmitter for the newer generations of memory device has an N-type transistor for pulling up an output node of the transmitter circuitry.

Furthermore, to make the transmitter circuitry universally compatible (e.g., such that the transmitter circuitry can work with the current and older generations of memory devices, as well as the newer generations of memory devices), a P-type transistor and an N-type transistor, which are coupled in parallel, can be used in the pull-up driver circuitry. When the transmitter circuitry is used with the current and older generations of memory devices (e.g., with a driver supply voltage greater than 1 V), the P-type transistor is used for pull-up, and the N-type transistor is disabled. On the other hand, when the transmitter circuitry is used with the newer generations of memory devices (e.g., with driver supply voltage less than 0.7 V), the N-type transistor is used for pull-up, and the P-type transistor is disabled. Thus, the transmitter circuitry can be used for the current and older generations of memory devices, as well as the newer generations of memory devices.

Also, using the N-type device makes it possible to make a pre-driver circuitry that operates on a relatively lower voltage (e.g., less than 0.7). This eliminates many high voltage components (e.g., components that operate at more than 1 V) in the pre-driver circuitry. For example, a conventional transmitter circuitry that has one or more P-type transistors for pull-up and one or more N-type transistors for pull-down, the pre-driver circuitry has multiple level shifters, a Vss-Hi power source (e.g., where the Vss-Hi power source is slightly higher than a ground voltage, but less than the supply voltage for the driver circuitry), etc. In contrast, because the transmitter circuitries discussed in this disclosure uses N-type transistors for both pull-up and pull-down, the pre-driver of the transmitter circuitries does not need these components (e.g., does not need multiple level shifters, Vss-Hi power source, etc.). This results in savings in terms of area, performance and/or power for the transmitter circuitries discussed in this disclosure, as compared to a conventional transmitter circuitry. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—e.g., scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

Figure 1:
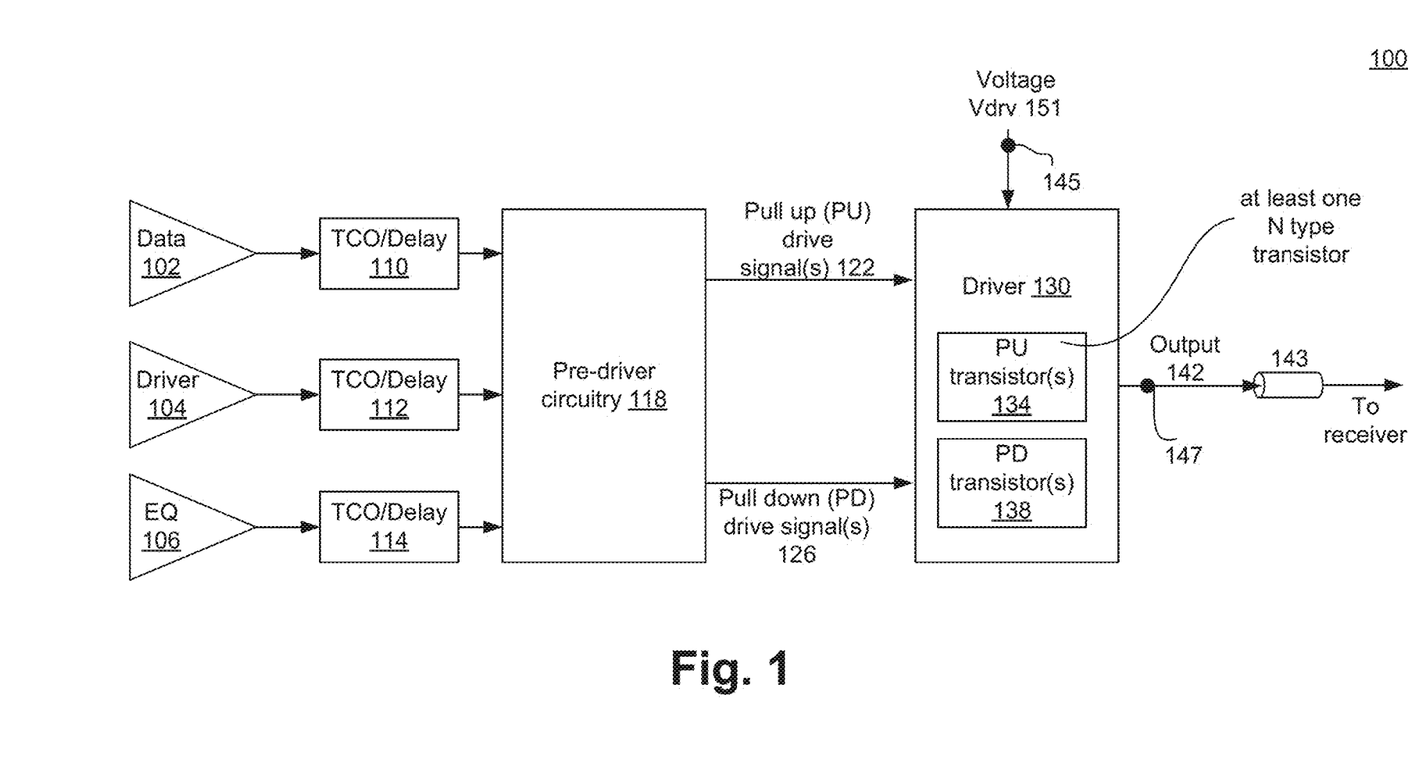
FIG. 1 schematically illustrates a transmitter circuitry, wherein a driver of the circuitry comprises one or more pull-up (PU) transistors and one or more pull-down (PD) transistors, and wherein at least one of the one or more PU transistors is an N-type transistor, according to some embodiments.

FIG. 1 schematically illustrates a transmitter circuitry 100 (also referred to as circuitry 100), wherein a driver 130 of the circuitry 100 comprises one or more pull-up (PU) transistors 134 and one or more pull-down (PD) transistors 138, and wherein at least one of the one or more PU transistors 134 is an N-type transistor, according to some embodiments.

In some embodiments, the circuitry 100 comprises a pre-driver circuitry 118 (also referred to as circuitry 118). The circuitry 118 receives data input 102 via a Time to Clock Out (TCO)/Delay circuitry 110. The circuitry 118 also receives driver input 104 via a TCO/Delay circuitry 112. The circuitry 118 also receives Equalizer input 106 via a TCO/Delay circuitry 114. In some embodiments and as will be discussed in further details herein, the pre-driver circuitry 118 may include decoders, pre-drive logic, etc., e.g., to generate pull-up (PU) drive signal(s) 122 and pull-down (PD) drive signals 126, e.g., based at least in part on the data 102. For example, the pre-driver circuitry 118 comprises decoders, multiplexers, level-shifters, etc., which translate the data 102 to the PU drive signals 122 and the PD drive signal 126.

The driver 130 comprises the one or more PU transistors 134 and one or more PD transistors 138. The PU transistors 134 and the PD transistors 138 control an output signal 142

(also referred to as output 142) at an output node 147, based on the data 102. For example, a high logical value of the data 102 results in a relatively high voltage at the output node 147 (e.g., the PU transistors 134 pull up the output node 142 to the relatively high voltage), and a low logical value of the data 102 results in a relatively low voltage at the output node 147 (e.g., the PD transistors 138 pull down the output node 142 to the relatively low voltage). In some embodiments, the driver 130 is driven by a drive voltage Vdrv 151 from a drive supply node 145. In some embodiments, a swing in the output signal 142 at the output node 147 (e.g., where the swing is a difference between a high voltage and a low voltage at the output node 147) may be based on the drive voltage Vdrv 151. The output 142 is transmitted to a receiver (not illustrated in FIG. 1) over a communication channel 143.

In an example, the circuitry 100 may be used in a transmitter of a memory controller and/or in a transmitter of a memory interface (e.g., as discussed with respect to FIG. 7 herein later). In an example, during current and previous generation of DDR technologies, relatively higher voltage may be used for driving the driver 130. As an example, if the memory controller is to be used with a DDR1 memory, the drive voltage Vdrv is about 2.5 V. For DDR2, DDR3, and DDR4, the drive voltage Vdrv is about 1.8V, 1.5V, and 1.2V, respectively. The newer generations of DDR memory, such as LP4× DDR, LP5 DDR, etc. may use lower voltage, for example, a voltage in the range of 0.7 to 0.3 V (e.g., at least less than 1.0 V). Thus, based on the memory for which the circuitry 100 is to be used, the drive voltage Vdrv can range from 1.2 V to 2.5 V (e.g., if DDR1, DDR2, DDR3, or DDR4 is used), or can range from 0.3 V to 0.7 V (e.g., if newer generation memory, such as LP4× DDR, LP5 DDR, DDR5, etc. is used).

Traditionally (e.g., for relatively higher values of the drive voltage Vdrv, such as the drive voltage Vdrv being at least as high as 1.0 V), P-type transistors are used for pull-up. This is because, for a relatively low drive voltage, N-type pull-up transistors may not be fully switched on. Using a N-type pull-up transistor may result in the swing at the output node to be in millivolt range, which is generally not sufficient for traditional transmitters.

However, as the drive voltage Vdrv in the circuitry 100 can be relatively low (e.g., at 0.7 V, or even lower), an N-type PU transistor may be switched on during pull-up state of the circuitry 100. As will be discussed herein in details, the N-type PU transistor may cause a voltage swing in the range of hundreds of millivolts (mV), e.g., in the range of about 150 mV to about 300 mV. Such a low voltage swing may be sufficient for modern transmitters and receivers, such as transmitters and receivers used for newer generation memory like LP4× DDR, LP5 DDR, DDR5, etc.

Figure 2:
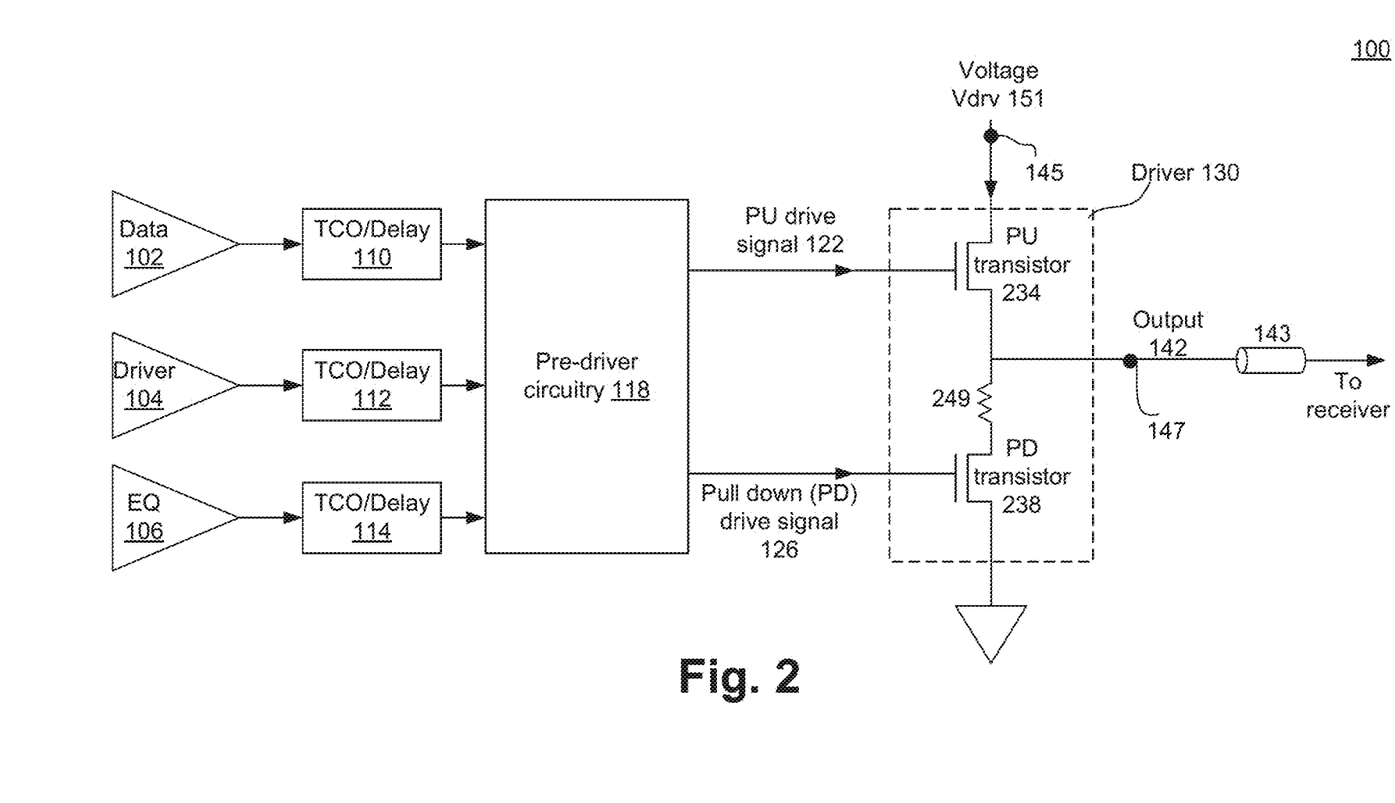
FIG. 2 illustrates an example implementation of the transmitter circuitry of FIG. 1 in further details, according to some embodiments.

FIG. 2 illustrates an example implementation of the transmitter circuitry 100 of FIG. 1 in further details, according to some embodiments. Specifically, the driver 130 is illustrated in further details.

In some embodiments, the driver 130 comprises a PU transistor 234 coupled between the drive supply node 145 and the output node 147. The driver 130 further comprises a resistor 249 and a PD transistor 238 coupled between the output node 147 and a ground terminal.

Although the resistor 249 is illustrated in FIG. 2, in an example, the resistor 249 (or any other resistor discussed with respect to any other figure) may be replaced by any appropriate resistive device, such as a transistor operating in an active region, a passive resistor offered by a process node (e.g., a poly resistor), a thin film resistor, devices made on front-end (e.g., active regions up to lower level metal layers such as Metal 3) of a die, devices made on a backend (upper level metal layers such as M4 and higher) of a die, off-chip resistive device, on-die resistive device, resistive devices formed in a substrate of a package, and/or the like.

In some embodiments, the transistor 234 is an N-type transistor, e.g., a N-type metal-oxide-semiconductor field-effect transistor (nMOS FET, NFET, or NMOS transistor). In some embodiments, the transistor 238 is a N-type transistor, e.g., nMOS FET, NFET, or NMOS transistor.

When a low or logical 0 bit of the data 102 is to be transmitted (also referred to as a pull-down state of the circuitry 100), the PU drive signal 122 switches off the PU transistor 234, and the PD drive signal 126 switches on the PD transmitter 238. As the drive voltage Vdrv 151 is cut off from the output node 147 (e.g., as the PU transistor 234 is off) and as the output node 147 is coupled to the ground terminal (e.g., via the PD transistor 238 and the resistor 249), the output 142 is pulled down and has a relatively low voltage (e.g., is zero or approaches zero).

When a high or logical 1 bit of the data 102 is to be transmitted (also referred to as a pull-up state of the circuitry 100), the PU drive signal 122 switches on the PU transistor 234, and the PD drive signal 126 switches off the PD transmitter 238. As the drive voltage Vdrv 151 is coupled to the output node 147 (e.g., via the PU transmitter 234) and as the output node 147 is cut off from the ground terminal (e.g., as the PD transistor 238 is off), the output 142 is pulled up and has a relatively high voltage.

In the example of FIG. 2, the drive voltage Vdrv is in the range of 0.3 V-0.7 V. The swing in the output node 147 (e.g., a voltage difference of the output node 147 between: the relatively high voltage corresponding to logical 1 of the data 102, and the relatively low voltage corresponding to logical 0 of the data 102) may be in the range of about 150 mV to about 300 mV, e.g., depending on the drive voltage Vdrv 151.

As discussed herein above, for relatively higher values of the drive voltage Vdrv 151 (e.g., such as the drive voltage Vdrv being at least as high as 1.2 V), P-type transistors are used for pull-up. This is because, for a relatively low drive voltage, N-type pull-up transistors may not be fully switched on. Also, using an N-type pull-up transistor may result in the swing at the output node to be in millivolt range, which is generally not sufficient for traditional transmitters. However, as the drive voltage Vdrv in the circuitry 100 of FIG. 2 is relatively low (e.g., at 0.7 V, or even lower), the N-type PU transistor 234 may be fully switched on during the pull-up state of the circuitry 100. The N-type transistors 234, 238 may cause a voltage swing of the output 142 in the range of hundreds of millivolts, e.g., in the range of about 150 mV to about 300 mV. Such a low voltage swing may be sufficient for modern transmitters and receivers, such as transmitters and receivers used for newer generation memory like LP4× DDR, LP5 DDR, DDR5, etc.

In an example, N-type transistors have relatively higher non-linearity when used as pullup transistors (e.g., N-type transistors pass 0 better than 1, due to its intrinsic nature). However, for lower output swing (e.g., an output swing of about 300 mV or less, such as those in memory interfaces of newer generation memory like LP4×, LP5, etc.), N-type transistors are a good choice (e.g., as P-type transistors cannot generally be used for such low output voltage swing). The overall impact to linearity due to the use of N-type transistors is relatively less, as the operations are occurring at $V_{DS}$ or output voltage swing of 300 mV or less.

Having a PU N-type transistor 234 enables the driver 130 to be linear, as the swing in the output 142 and the drive voltage Vdrv 151 are relatively low. The PU N-type transistor 234 may cause non-linearity at a higher value of the drive voltage Vdrv 151—but as the drive voltage Vdrv 151 is upper bounded by about 0.7 V for the example of FIG. 2, no such non-linearity is experienced in the driver 130.

In traditional drive circuitries, no resistors are coupled in series with a pull-down transistor, rather, a resistor is usually coupled at the output node 142, e.g., in series with a communication channel (e.g., the communication channel 143). However, in the circuitry 100, the driver 130 has the resistor 249 in series with the PD transistor 238. For example, as an N-type transistor 234 is used as the PU transistor, a resistor between the PU transistor 234 and the channel 143 may effectively drop the drive voltage Vdrv 151, thereby making it difficult for the N-type PU transistor to be fully switched on during the pull-up stage. Accordingly, during the pull-up stage (e.g., when the PU transistor 234 is to be switched on, and the PD transistor 238 is to be switched off), it is desirable to not insert a resistor in series with the PU transistor 234. Hence, the circuitry 100 lacks a resistor in series with the channel 143. If such a resistor is present in series with the channel, it may adversely affect the switching on process of the N-type PU transistor 234, and hence, adversely affect the linearity of the driver 130. However, the resistor 249 in series with the PD transistor 238 dominates on the linearity of the driver 130, thereby helping the driver 130 achieve linearity.

Figure 3:
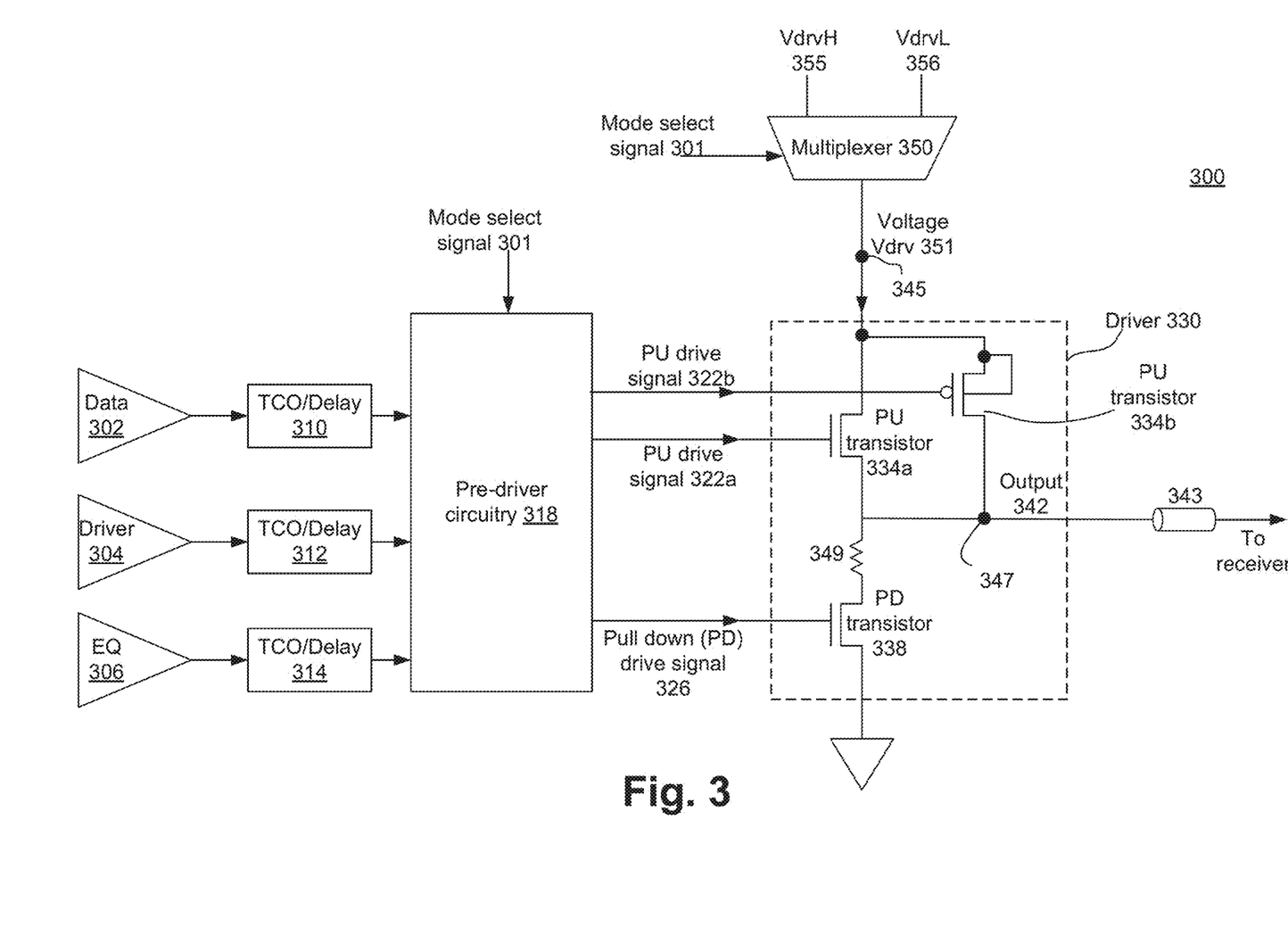
FIG. 3 schematically illustrates a transmitter circuitry, wherein a driver of the circuitry comprises an N-type PU transistor and a P-type PU transistor, according to some embodiments.

FIG. 3 schematically illustrates a transmitter circuitry 300 (also referred to as circuitry 300), wherein a driver 330 of the circuitry 300 comprises an N-type PU transistor 334a and a P-type PU transistor 334b, according to some embodiments.

The circuitry 300 is at least in part similar to the circuitry 100 of FIGS. 1 and 2. For example, similar to the circuitry 100, the circuitry 300 comprises a pre-driver circuitry 318 (also referred to as circuitry 318) that receives data input 302 (e.g., via a TCO/Delay circuitry 310), driver input 304 (e.g., via a TCO/Delay circuitry 312), and Equalizer input 306 (e.g., via a TCO/Delay circuitry 314).

In some embodiments, the pre-driver circuitry 318 may include decoders, pre-drive logic, etc., e.g., to generate PU drive signals 322a and 322b, which respectively controls PU transistors 334a and 334b. The pre-driver circuitry 318 also generates a PD drive signal 326 to control an N-type PD transistor 338.

The driver 330 comprises the PU transistors 334a, 334b, and the PD transistor 338. The PU transistors 334a, 334b are coupled in parallel between a drive supply node 345 and an output node 347. The transistor 334b is a compensated P-type transistor, with a source of the transistor 334b coupled to a gate of the transistor 334b. A resistor 349 and the PD transistor 338 coupled in series between the output node 347 and a ground terminal (e.g., similar to FIG. 2).

The circuitry 300 further comprises a multiplexer 350 to receive a high drive voltage VdrvH 355 and a low drive voltage VdrvL 356. The high drive voltage VdrvH 355 may be higher than the low drive voltage VdrvL 356. A mode select signal 301 controls the multiplexer 350. The multiplexer 350 outputs one of the high drive voltage VdrvH 355 or the low drive voltage VdrvL 356 as an output at the drive supply node 345 as the drive voltage Vdrv 351, based on the mode select signal 301.

Merely as an example, while the circuitry 100 of FIGS. 1 and 2 may be used for low voltage operation (e.g., where the drive voltage Vdrv 151 may have a value of 0.7 V or lower), the circuitry 300 may be suited for both low voltage and high voltage operation.

For example, when the circuitry 300 is to be used with a memory that has a relatively higher voltage rating (e.g., DDR1, DDR2, DDR3, DDR4, etc.), the high drive voltage VdrvH 355 may be output by the multiplexer 350—this mode of operation of the circuitry 300 is also referred to as a high voltage mode of the circuitry 300. For the high voltage mode of the circuitry 300, the high drive voltage VdrvH 355 may be in the range of about 1.2 V to about 2.5 V, e.g., may be higher than at least 1.0 V.

Also, when the circuitry 300 is to be used with a memory that has a relatively lower voltage rating (e.g., LP4× DDR, LP5 DDR, DDR5, etc.), the low drive voltage VdrvL 356 may be output by the multiplexer 350—this mode of operation of the circuitry 300 is also referred to as a low voltage mode of the circuitry 300. For the low voltage mode of the circuitry 300, the low drive voltage VdrvL 356 may be in the range of about 0.3 V to about 0.7 V, or at least less than 1 V. Thus, the mode select signal 301 may be set based on a memory with which the circuitry 300 is being used.

For reasons discussed with respect to FIGS. 1 and 2, when the circuitry 300 operates in the low voltage mode (e.g., the drive voltage Vdrv 351 at node 345 is the voltage VdrvL 356), the N-type PU transistor 334a may be sufficient to pull-up the output node 347, e.g., to produce sufficient swing at the output node 347 (e.g., a swing in the range of about 150 mV-300 mV, as discussed with respect to FIGS. 1-2). Thus, when the circuitry 300 operates in the low voltage mode, the P-type PU transistor 334b is always switched off, and the N-type PU transistor 334a is selectively switched on (e.g., when the output node 347 is to be pulled up to a relatively high voltage) and off (e.g., when the output node 347 is to be pulled down to a relatively low voltage). Hence, when the circuitry 300 operates in the low voltage mode, the N-type PU transistor 334a and the N-type PD transistor 338 are used to control the output node 347.

The pre-driver circuitry 318 also receives the mode select signal 301. In some embodiments, when the circuitry 300 operates in the low voltage mode, the pre-driver circuitry 318 generates the PU drive signals 322a, 322b, such that the P-type PU transistor 334b is switched off during pull-up and pull-down of the output node 247, and the N-type PU transistor 334a is switched on or off to respectively pull-up or pull-down the output node 247.

On the other hand, in some embodiments, when the circuitry 300 operates in the high voltage mode, the pre-driver circuitry 318 generates the PU drive signals 322a, 322b, such that the N-type PU transistor 334a is switched off during pull-up and pull-down of the output node 347, and the P-type PU transistor 334b is switched on or off to respectively pull-up or pull-down the output node 347.

Figure 4:
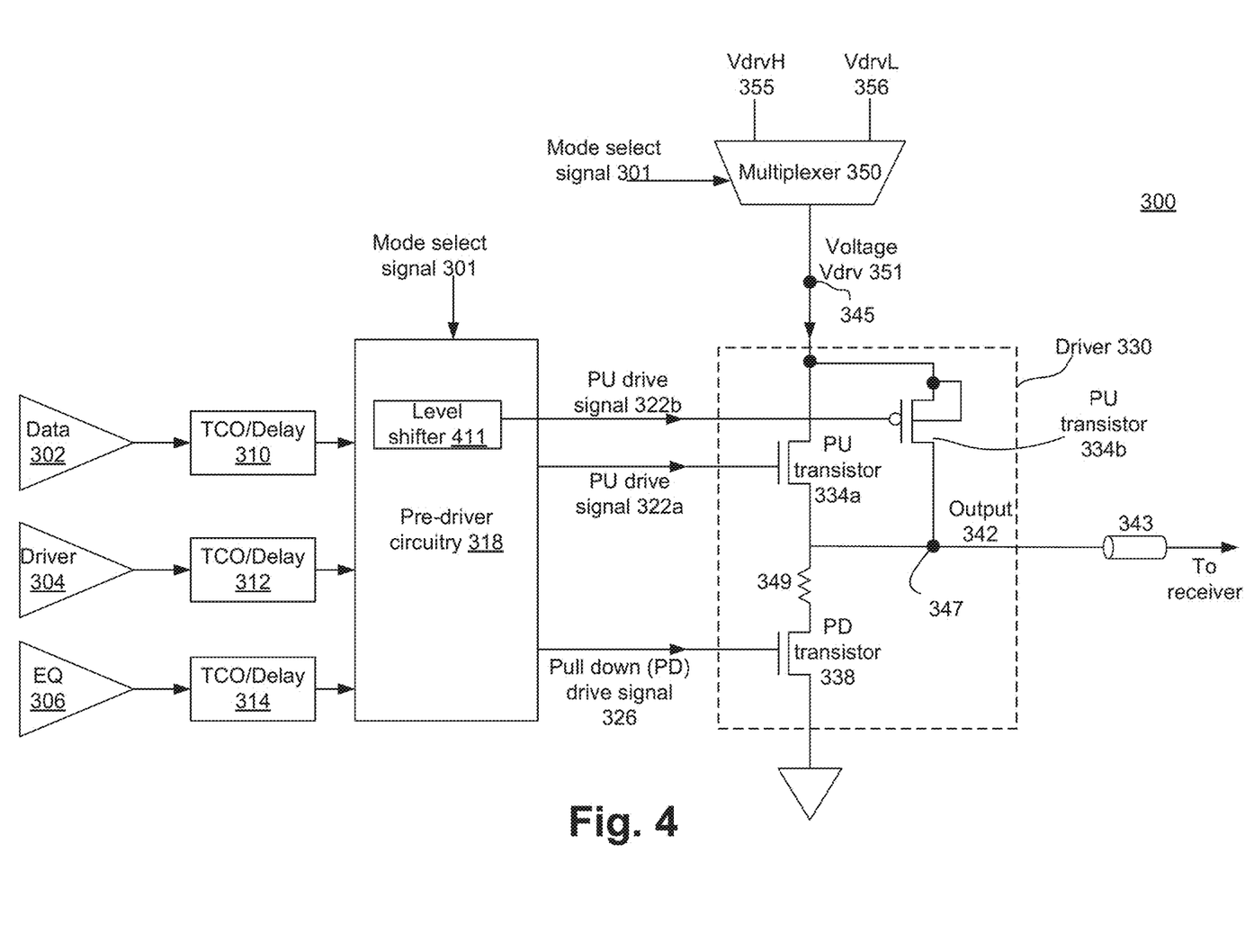
FIG. 4 schematically illustrates the transmitter circuitry of FIG. 3, where a level shifter is used to generate a PU drive signal for the P-type PU transistor, according to some embodiments.

FIG. 4 schematically illustrates the transmitter circuitry 300 of FIG. 3, where a level shifter 411 is used to generate the PU drive signal 322b for the P-type PU transistor 334b, according to some embodiments. For example, as discussed herein above, the N-type PU transistor 334a is used during the low voltage mode of the circuitry 300, and the P-type PU transistor 334b is used during the high voltage mode of the circuitry 300. The PU drive signal 322a (and one or more other components of the pre-driver circuitry 318) may operate at a relatively low voltage, e.g., compared to a voltage level of the PU drive signal 322b. Thus, in some embodiments, the level shifter 411 is used to generate the PU drive signal 322b at the relatively high voltage, e.g., when the circuitry 300 operates in the high voltage mode. The level shifter 411 is used to change a voltage level of the PU drive signal 322b from a relatively low voltage (e.g., at which the pre-driver circuitry 318 operates) to the relatively high voltage (e.g., at which the gate of the PU transistor 334b operates).

Figure 5:
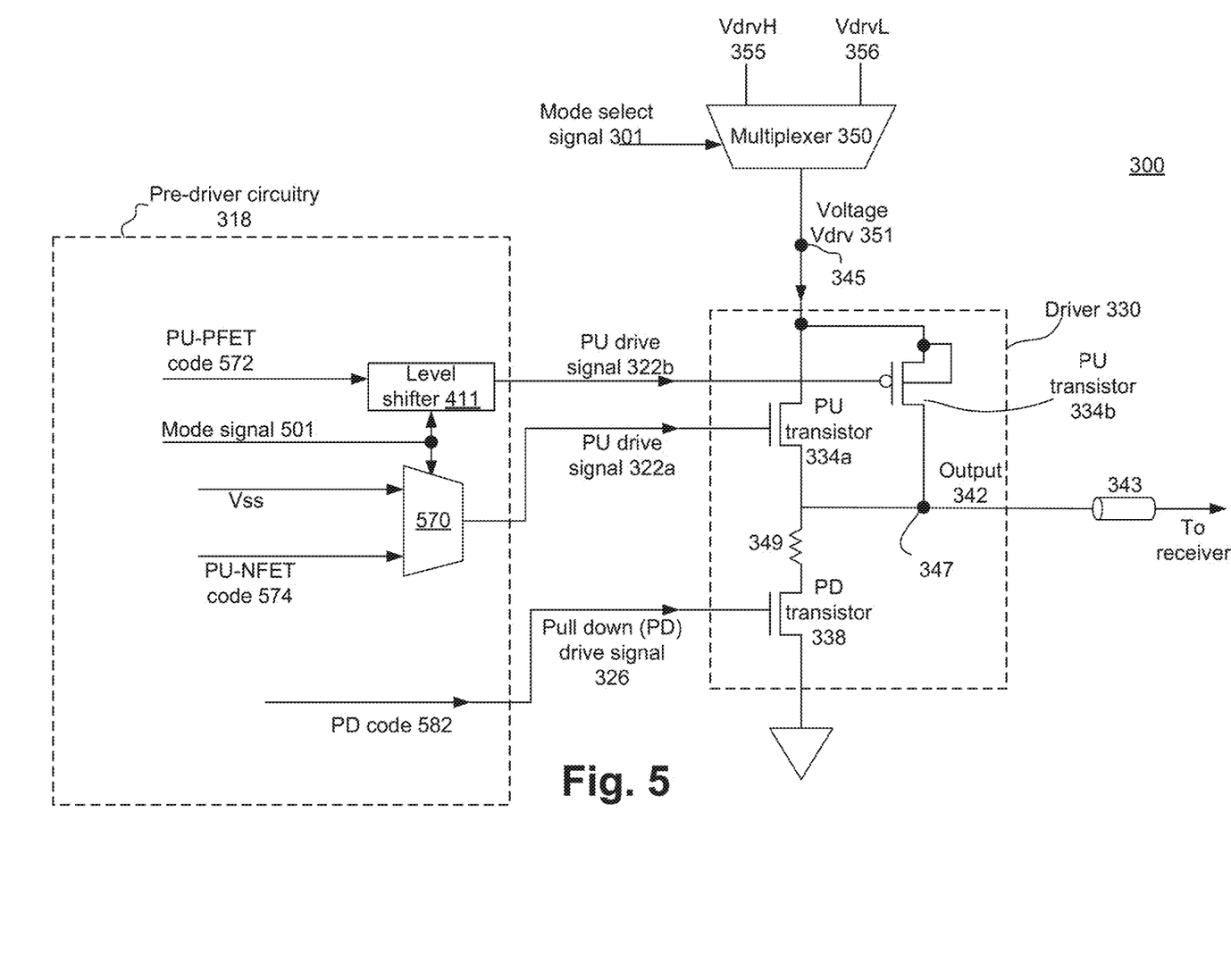
FIG. 5 schematically illustrates the transmitter circuitry of FIG. 3, and also illustrates an example implementation of a pre-driver circuitry, according to some embodiments.

FIG. 5 schematically illustrates the transmitter circuitry 300 of FIG. 3, and also illustrates an example implementation of the pre-driver circuitry 318, according to some embodiments. In some embodiments, the pre-driver circuitry 318 receives a PU-PFET code 572 and/or a PU-NFET code 574. For example, the PU-PFET code 572 is used to generate the PU drive signal 322b, e.g., when the circuitry 300 is operating at the high voltage mode. The PU-NFET code 574 is used to generate the PU drive signal 322a, e.g., when the circuitry 300 is operating at the low voltage mode. Thus, in essence, the PU-PFET code 572 is to control the P-type PU transistor 334b, and the PU-NFET code 574 is to control the N-type PU transistor 334a. The PU-PFET code 572 and/or the PU-NFET code 574 are generated based on the data 102. For example, a high logical value of the data 102 implies that the output node 347 is to be pulled up by the drive voltage Vdrv 351, and one of the PU transistors 334a, 334b is to be switched on (e.g., depending on the operating mode of the circuitry 300). On the other hand, a low logical value of the data 102 implies that the output node 347 is to be pulled down, and the PU transistors 334a, 334b is to be switched off. The PU-PFET code 572 and/or the PU-NFET code 574 are generated accordingly, e.g., based on the data 102.

As discussed with respect to FIG. 3, the mode select signal 301 indicates whether the circuitry 300 is operating in the high voltage mode, or the low voltage mode. The pre-driver circuitry 318 in FIG. 5 receives a mode signal 501, which is also indicative of whether the circuitry 300 is operating in the high voltage mode, or the low voltage mode. For example, the mode select signal 301 and the mode signal 501 may be the same signal, may be derived from the signal source, are correlated, and/or the like.

As discussed with respect to FIG. 4, the PU drive signal 322b may be at a higher voltage level than, for example, one or more components of the pre-driver circuitry 318. Accordingly, in FIG. 5, the level shifter 411 receives the PU-PFET code 572 and generates the PU drive signal 322b. The PU drive signal 322b may have a higher voltage level than the PU-PFET code 572.

In some embodiments, the mode signal 501 controls the level shifter 411. For example, if the mode signal 501 indicates a low voltage mode, the level shifter 411 may generate the PU drive signal 322b such that the P-type PU transistor 334b is off during pull-up stage and pull-down stage. For example, if the mode signal 501 indicates a high voltage mode, the level shifter 411 may generate the PU drive signal 322b based on the PU-PFET code 572.

In some embodiments, a multiplexer 570 of the pre-driver circuitry 318 receives the PU-NFET code 574 and a voltage Vss, where the voltage Vss may be a ground voltage (e.g., substantially zero). The multiplexer 570 outputs the PU drive signal 322a, and is controlled by the mode signal 501. For example, if the mode signal 501 indicates a high voltage mode, the multiplexer 570 may output the voltage Vss, such that the N-type PU transistor 334a is off during the pull-up stage and the pull-down stage. For example, if the mode signal 501 indicates a low voltage mode, the multiplexer may output the PU-NFET code 574, such that the N-type PU transistor 334a is turned on and off based on the PU-NFET code 574 (e.g., which is based on the data 102).

In some embodiments, the pre-driver circuitry 318 receives a PD code 582. During operation of the circuitry 300, the pre-driver circuitry 318 outputs the PD code 582 as the PD drive signal 326. The PD code 582 is derived from the data 102, and is used to operate the PD transistor 338. For example, the PD code 582 is to switch on or off the PD transistor 338, e.g., based on whether the output node 347 is to be pulled down or pulled up, respectively.

Referring to FIGS. 1-5, using the N-type transistor in the circuitries 100, 300 makes it possible to make a pre-driver circuitry operate on a relatively lower voltage (e.g., less than 0.7). This eliminates many high voltage components (e.g., components that operate at more than 1 V) in the pre-driver circuitry. For example, a conventional transmitter circuitry that has one or more P-type transistors for pull-up and one or more N-type transistors for pull-down, the pre-driver circuitry has multiple level shifters, a Vss-Hi power source (e.g., where the Vss-Hi power source is slightly higher than a ground voltage, but less than the supply voltage for the driver circuitry), etc. In contrast, because the transmitter circuitries 100, 300 use N-type transistors for both pull-up and pull-down, the pre-driver 118, 318 of the transmitter circuitries 100, 300 does not need these components (e.g., does not need multiple level shifters, Vss-Hi power source, etc.). This results in savings in terms of area, performance and/or power for the transmitter circuitries 100, 300, as compared to a conventional transmitter circuitry.

Figure 6:
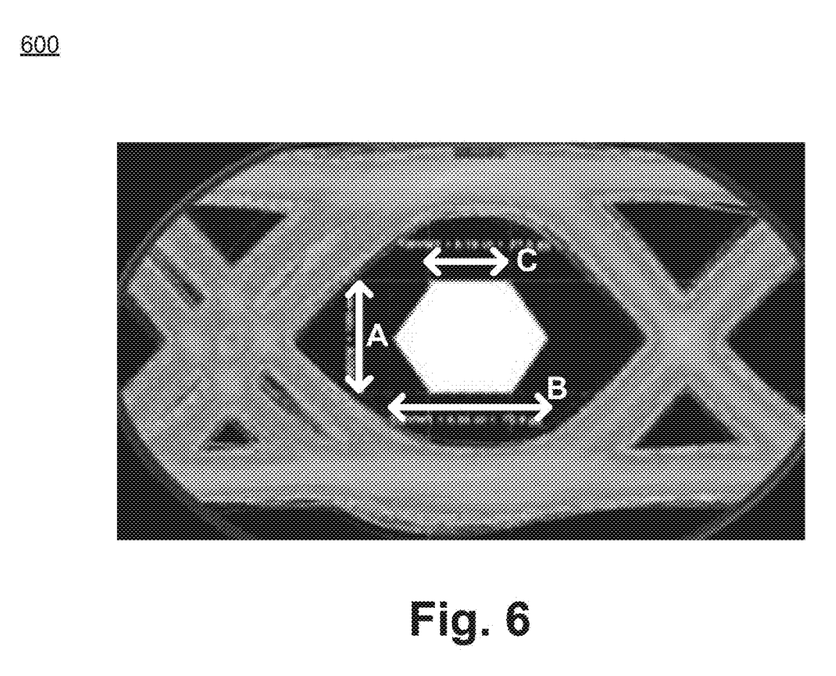
FIG. 6 illustrates an example eye diagram generated by any of the transmitter circuitries of FIGS. 1-5, according to some embodiments.

FIG. 6 illustrates an example eye diagram 600 generated by the circuitry 100 of FIGS. 1-2, or by the circuitry 300 of FIGS. 3-5 (e.g., when the circuitry 300 operates in the low voltage mode), according to some embodiments. The eye diagram 600 may be generated by the output of the circuitry 100 or 300, e.g., at the receiver (e.g., that is coupled to the communication channel 143 or 343).

Merely as examples, the arrow A in the eye diagram 600 represents about 100 mV. The total swing in the voltage in the eye diagram 600 may be in the range of about 150 mV-300 mV. As discussed herein earlier, this may correspond to the drive voltage Vdrv of the circuitries 100, 300 to be in the range of about 0.3-0.7 V. The arrows B and C are associated with the eye width. In an example, the arrow B represents about 72.9 pico-seconds (ps) and the arrow C represents about 37.5 ps. Even for such a low value of the drive voltage Vdrv (e.g., in the range of about 0.3-0.7 V) of the circuitries 100, 300, the eye diagram 600 provides distinct eye opening, thereby providing accurate detection of the output of the circuitries 100, 300.

Figure 7:
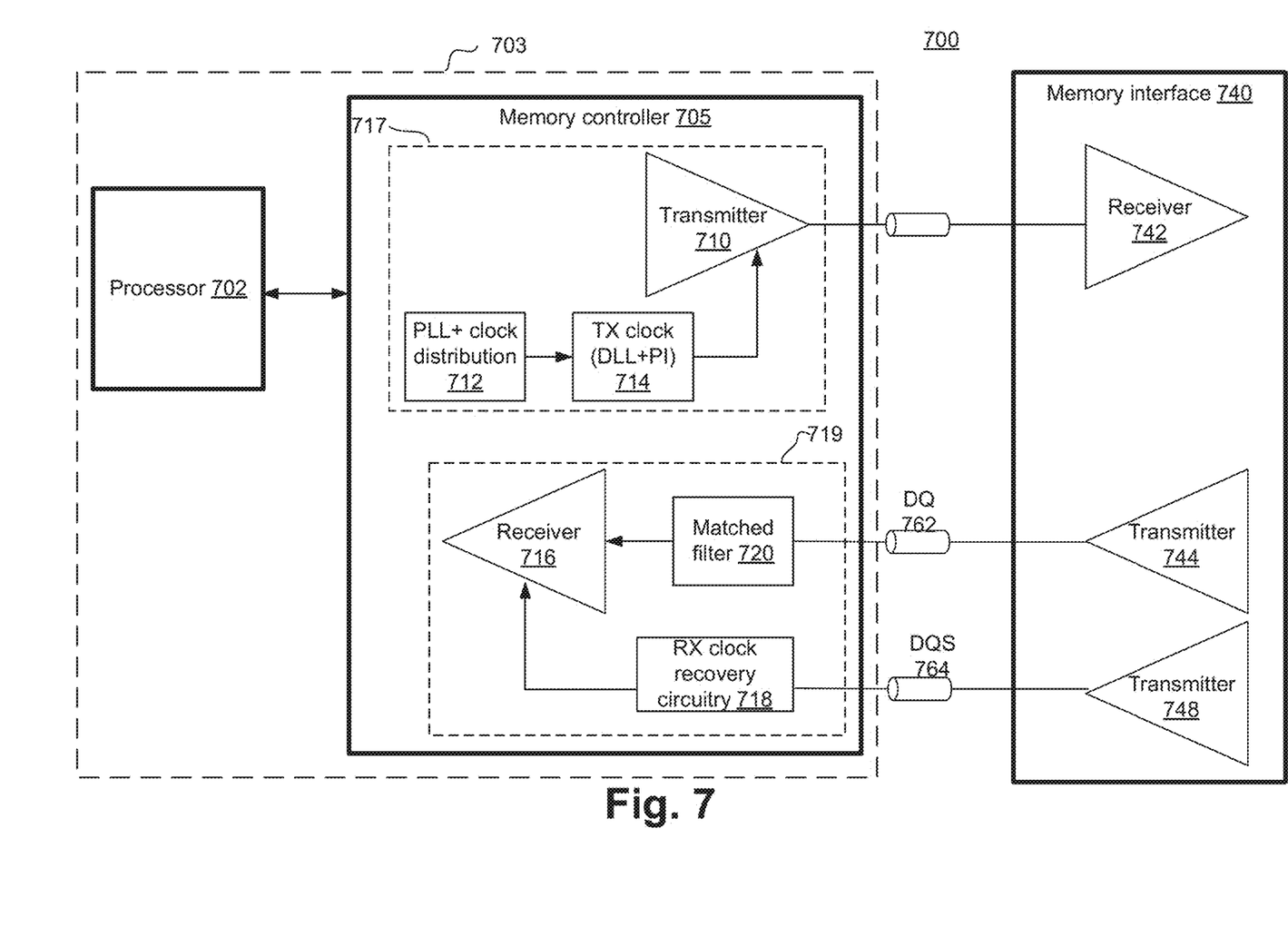
FIG. 7 illustrates a system in which any of the transmitter circuitries of FIGS. 1-5 may be used, according to some embodiments.

FIG. 7 illustrates a system 700 in which the transmitter circuitries 100, 300 of FIGS. 1-5 may be used, according to some embodiments. The system 700 comprises a memory controller 705 communicating with a memory interface 740 (e.g., where the memory interface 740 is coupled to a memory, the memory not illustrated in FIG. 7). A processor 702 may be communicatively coupled to the memory controller 705. In an example, the memory controller 705 may be combined with the processor 702, and hence, the memory controller 705 and the processor 702 are illustrated within a dotted box 703.

The memory controller 705 comprises a transmitter block 717, which includes: a Phase Locked Loop (PLL) and Clock Distribution circuity 712, a transmitter (TX) clock circuitry 714 which includes a Delay Locked Loop (DLL) and Phase Integrator (PI) TX, and a transmitter circuitry 710.

The memory controller 705 also comprises of a matched receiver 719, which includes a matched filter 720, an Rx Clock recovery circuitry 718, and an RX receiver circuitry 716. The Rx clock recovery circuitry 718 extracts the clock signal from the received data stream through data output strobe DQS 764, and comprises a Voltage Controlled Delay Line (VCDL) and a Phase Integrator (PI). The matched filter 720 operates such that the delay on the data output DQ 762 matches at least the minimum delay of the data output strobe DQS 764. The receiver RX 716 extracts the data from the data stream output of the matched filter 720.

The memory interface 740 comprises an RX receiver 742. The memory interface 740 also comprises transmitter circuitries 744 and 748, which transmit data output DQ 762 and data output strobe DQS 764, respectively, to the memory controller 705.

In some embodiments, any one or more of the transmitters 710, 744, 748 may be implemented using any one of the transmitter circuitries 100, 300 of FIGS. 1-5. In an example, if the circuitry 300 is used, depending on the type of memory coupled to the memory interface 740, either the high voltage mode or the low voltage mode of the circuitry 300 may be used for the transmitters of the system 700, as discussed with respect to FIGS. 3-5.

Figure 8:
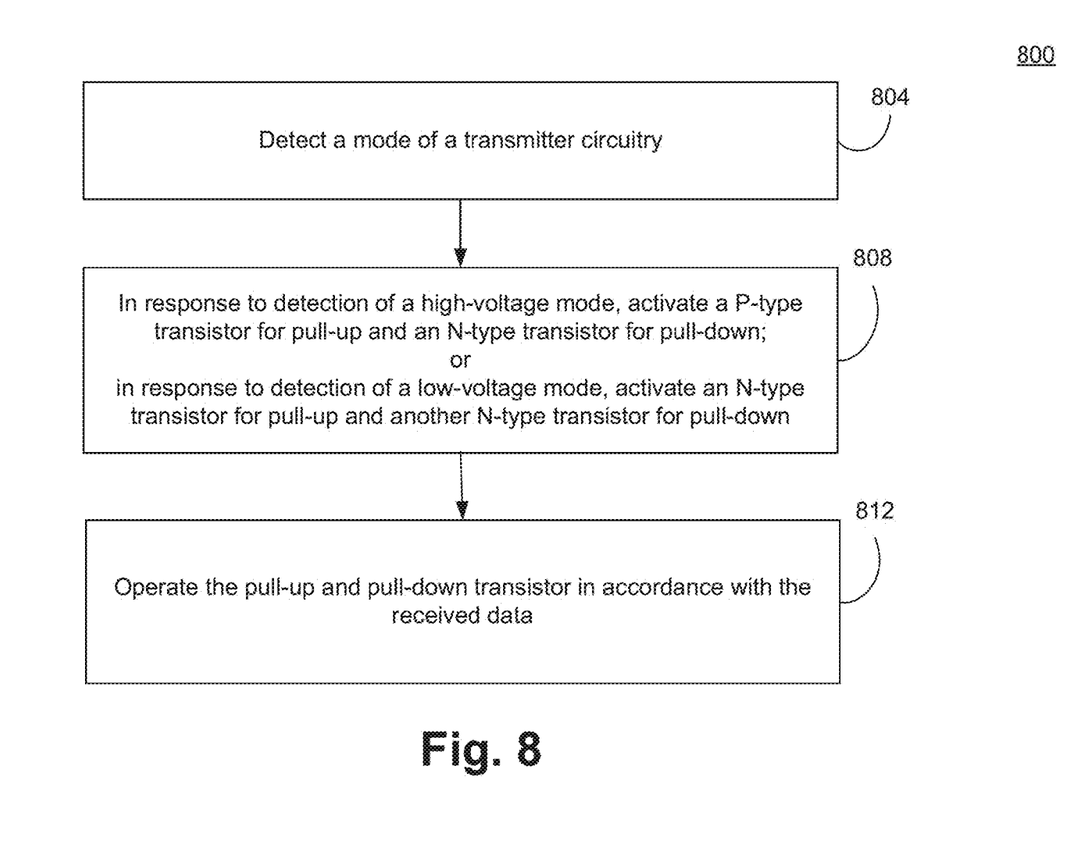
FIG. 8 illustrates a flowchart depicting a method for operating the transmitter circuitry of any of FIGS. 3-5, according to some embodiments.

FIG. 8 illustrates a flowchart depicting a method 800 for operating the transmitter circuitry 300 of any of FIGS. 3-5, according to some embodiments. Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 may be optional in accordance with certain embodiments. The numbering of the blocks presented is for the sake of clarity and is not intended to prescribe an order of operations in which the various blocks must occur.

At 804, a mode of the transmitter circuitry 300 is detected. For example, the mode select signal 301 and/or the mode signal 501 is indicative of the mode of the circuitry 300. As discussed with respect to FIGS. 3-5, the mode of the circuitry 300 may be one of the high voltage mode, or the low voltage mode.

At 808, in response to detection of the high-voltage mode, a P-type transistor (e.g., P-type PU transistor 334b) is activated for pull-up and an N-type transistor (e.g., N-type PD transistor 338) is activated for pull-down. As also discussed with respect to FIGS. 3-5, for the high-voltage mode, the drive supply node 345 receives the high drive voltage VdrvH 355, and the multiplexer 570 outputs Vss to cause the PU transistor 334a to be off.

Also, at 808, on the other hand, in response to detection of the low-voltage mode, an N-type transistor (e.g., N-type PU transistor 334a) is activated for pull-up and another N-type transistor (e.g., N-type PD transistor 338) is activated for pull-down. As also discussed with respect to FIGS. 3-5, for the low-voltage mode, the drive supply node 345 receives the low drive voltage VdrvL 356, and the multiplexer 570 outputs the PU-NFET code 574, e.g., to cause the PU transistor 334a to be switched on and/or off, based on the data 102. The P-type PU transistor 334b is switched off during the low-voltage mode of operation.

At 812, the pull-up transistor (e.g., either of the PU transistors 334a or 334b, based on the mode) and pull-down transistor (e.g., the PD transistor 338) are operated to pull up and/or pull down the output node 347, in accordance with the received data 102, e.g., as discussed with respect to FIGS. 3-5.

Figure 9:
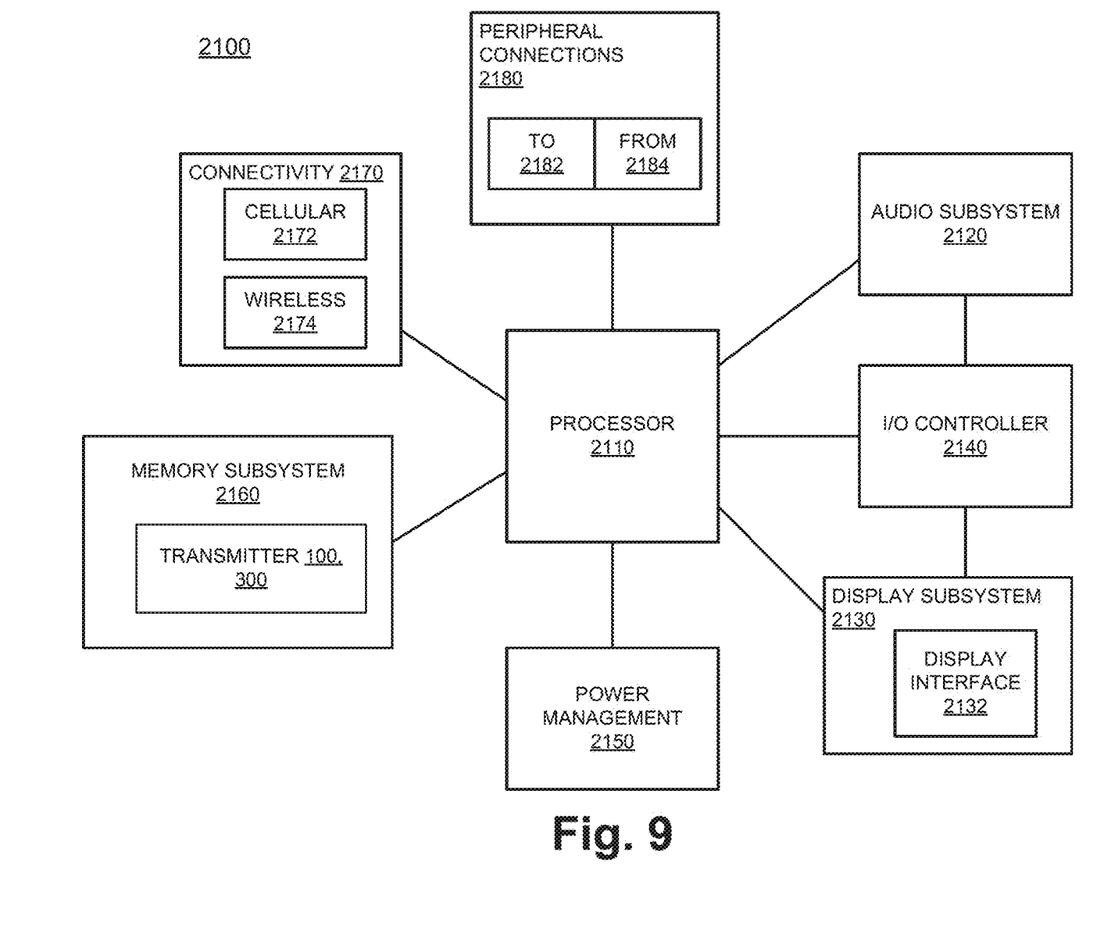
FIG. 9 illustrates a computer system, a computing device or an SoC (System-on-Chip), where the computing device includes one or more of the transmitter circuitries of FIGS. 1-8, wherein the transmitter circuitries include at least one N-type transmitter in the pull-up path, according to some embodiments.

FIG. 9 illustrates a computer system, a computing device or a SoC (System-on-Chip) 2100, where the computing device includes either, or both, of the transmitter circuitry 100 or 300 of FIGS. 1-8, wherein the transmitter circuitries 100, 300 includes at least on N-type transmitter in the pull-up path, according to some embodiments. It is pointed out that those elements of FIG. 9 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to, display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 includes the transmitter circuitry 100 and/or the transmitter circuitry 300 of FIGS. 1-8. Merely as an example, the transmitter circuitries 100 and/or 300 may be in the memory subsystem 2160, e.g., transmitting data to, or from, a memory (e.g., as discussed with respect to FIG. 7). In another example, the transmitter circuitries 100 and/or 300 may be in any appropriate component of the computing device 2100. As discussed herein with respect to FIGS. 1-8, the transmitter circuitries 100 and/or 300 include at least one N-type transistor for pulling up an output node.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a first transistor coupled between a first supply node and an output node; a resistive device and a second transistor coupled in series between the output node and a second supply node; and a pre-driver circuitry to receive data, and to output a first control signal and a second control signal to respectively control the first transistor and the second transistor, wherein the first transistor is an N-type transistor.

Example 2. The apparatus of example 1 or any other example, further comprising: a third transistor coupled between the first supply node and the output node, wherein the third transistor is a P-type transistor, and wherein the circuitry is to output a third control signal to control the third transistor.

Example 3. The apparatus of example 2 or any other example, wherein: the circuitry is to switch off the third transistor via the third control signal, in response to a voltage at the first supply node being lower than a threshold voltage.

Example 4. The apparatus of example 2 or any other example, further comprising: a multiplexer to receive a first power supply and a second power supply, and output one of the first or second power supply to the first supply node.

Example 5. The apparatus of example 4 or any other example, wherein: the multiplexer, in a first mode of operation, is to output the first power supply at a first voltage level to the first supply node; the first voltage level is lower than a second voltage level of the second power supply; and the circuitry is to, in the first mode of operation, switch off the third transistor via the third control signal.

Example 6. The apparatus of example 5 or any other example, wherein: wherein the circuitry is to, in the first mode of operation, control on and off states of the first transistor and the second transistor, to selectively pull up or pull down the output node based on the data.

Example 7. The apparatus of example 5 or any other example, wherein: the multiplexer, in a second mode of operation, is to output the second power supply at the second voltage level to the first supply node; and the circuitry is to, in the second mode of operation, switch off the first transistor of operation via the first control signal.

Example 8. The apparatus of example 7 or any other example, wherein: the circuitry is to, in the second mode of operation, control on and off states of the second transistor and the third transistor, to selectively pull up or pull down the output node based on the data.

Example 9. The apparatus of example 5 or any other example, wherein: the first voltage level is equal to, or lower than, 0.7 volts (V); and the second voltage level is higher than 1.0 V.

Example 10. The apparatus of example 1 or any other example, wherein: the apparatus is a transmitter circuitry included in one of: a memory controller that is to transmit data to a memory interface, or the memory interface that is coupled to a memory.

Example 11. The apparatus of example 1 or any other example, wherein: the first supply node is at a higher voltage than a voltage of the second supply node; and an output signal at the output node is indicative of the data.

Example 12. A system comprising: a memory to store instructions; a processor to execute the instructions; a wireless interface to facilitate the processor to communicate with another system; and a transmission circuitry to transmit data to, or from, the memory over a channel, the transmission circuitry comprising: a first transistor and a second transistor to pull up voltage of the channel, wherein the first transistor is coupled in parallel to the second transistor, and wherein at least one of the first transistor or the second transistor is an N-type transistor, and a third transistor to pull down the voltage of the channel, wherein the third transistor is an N-type transistor.

Example 13. The system of example 12 or any other example, wherein the transmission circuitry further comprises: a resistive device coupled in series with the third transistor.

Example 14. The system of example 12 or any other example, wherein at most one of the first transistor or a second transistor is be switched on at a given time.

Example 15. The system of example 12 or any other example, wherein: the first transistor comprises the N-type transistor; and the second transistor comprises a P-type transistor.

Example 16. The system of example 15 or any other example, wherein the first transistor and the second transistor are coupled between a supply node and the channel, and wherein the transmission circuitry comprises: a multiplexer to receive a first power supply and a second power supply, and output one of the first or second power supply to the supply node.

Example 17. A transmitter circuitry comprising: a first pull-up (PU) transistor and a second pull-up (PU) transistor coupled in parallel between a supply node and an output node, wherein the first PU transistor comprises a P-type transistor, and wherein the second PU transistor comprises an N-type transistor; a pull-down (PD) transistor coupled between the output node and a ground terminal; and a multiplexer to selectively output, to the supply node, one of: a first voltage or a second voltage.

Example 18. The transmitter circuitry of example 17 or any other example, further comprising: a resister coupled in series with the PD transistor, such that the resistor and the PD transistor are coupled between the output node and the ground terminal.

Example 19. The transmitter circuitry of example 17 or any other example, wherein a source of the first PU transistor is coupled to a gate of the first PU transistor.

Example 20. The transmitter circuitry of example 17 or any other example, wherein: the first voltage is higher than the second voltage; and in response to the first voltage being output by the multiplexer to the supply node: the first PU transistor is to be selectively switched on or off, based on data to be transmitted over the output node, and the second PU transistor is to be switched off.

Example 21. The transmitter circuitry of example 17 or any other example, wherein: the first voltage is higher than the second voltage; and in response to the second voltage being output by the multiplexer to the supply node: the second PU transistor is to be selectively switched on or off, based on data to be transmitted over the output node, and the first PU transistor is to be switched off.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first transistor coupled between a first supply node and an output node, wherein the first transistor is an N-type transistor;
a resistive device and a second transistor coupled in series between the output node and a second supply node;
a third transistor coupled between the first supply node and the output node, wherein the third transistor is a P-type transistor;
a multiplexer to receive a first power supply and a second power supply, and output the first power supply to the first supply node in a first mode of operation and output the second power supply to the first supply node in a second mode of operation, wherein a first voltage level of the first power supply is lower than a second voltage level of the second power supply; and
a pre-driver circuitry to receive data, and to output a first control signal to control the first transistor, a second control signal to control the second transistor, and a third control signal to control the third transistor,
wherein, in the first mode of operation, the pre-driver circuitry is to turn-off the third transistor and is to use the first transistor to selectively pull-up the output node based on the data;
wherein, in the second mode of operation, the pre-driver circuitry is to turn-off the first transistor and is to use the third transistor to selectively pull-up the output node based on the data;
wherein the pre-driver circuitry includes a level shifter; and
wherein the level shifter, in the second mode of operation, changes a voltage level of the third control signal from a voltage level at which the pre-driver circuitry operates to a voltage level at which the gate of the third transistor operates.

2. The apparatus of claim 1, wherein:
the pre-driver circuitry is to turn off the third transistor via the third control signal, in response to a voltage at the first supply node being lower than a threshold voltage.

3. The apparatus of claim 1, wherein:
the pre-driver circuitry is to, in the first and second modes of operation, control the second transistor to selectively pull down the output node based on the data.

4. The apparatus of claim 1, wherein:
the first voltage level is equal to, or lower than, 0.7 volts (V); and
the second voltage level is higher than 1.0 V.

5. The apparatus of claim 1, wherein:
the apparatus is a transmitter circuitry included in one of: a memory controller that is to transmit data to a memory interface, or the memory interface that is coupled to a memory.

6. The apparatus of claim 1, wherein:
the first and second voltage levels of the first supply node are at a higher voltage than a voltage of the second supply node; and
an output signal at the output node is indicative of the data.

* * * * *